United States Patent
Eiles et al.

(10) Patent No.: US 6,607,928 B1
(45) Date of Patent: Aug. 19, 2003

(54) INTEGRATED CIRCUIT DEVICE HAVING AN EMBEDDED HEAT SLUG

(75) Inventors: Travis M. Eiles, San Jose, CA (US); Mario J. Paniccia, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/676,268

(22) Filed: Sep. 28, 2000

Related U.S. Application Data

(62) Division of application No. 09/001,704, filed on Dec. 30, 1997.

(51) Int. Cl.[7] .............................................. H01L 21/66
(52) U.S. Cl. ........................................ 438/16; 438/122
(58) Field of Search ........................... 438/15, 16, 122, 438/584, 26, 108, 977; 257/706, 707, 720, 712, 713, 717, 796

(56) References Cited

U.S. PATENT DOCUMENTS

| | | | | |
|---|---|---|---|---|
| 4,203,129 A | | 5/1980 | Oktay et al. ................... 357/82 |
| 4,224,734 A | * | 9/1980 | Tiefert et al. .................. 29/583 |
| 4,582,954 A | | 4/1986 | Eaton et al. .................... 174/16 |
| 4,630,172 A | | 12/1986 | Stenerson et al. ........... 361/386 |
| 4,649,992 A | | 3/1987 | Geen et al. ................... 165/185 |
| 4,744,008 A | | 5/1988 | Black et al. .................. 361/386 |
| 5,045,503 A | * | 9/1991 | Kobiki et al. ................ 438/584 |
| 5,070,040 A | | 12/1991 | Pankove ....................... 437/209 |
| 5,105,259 A | * | 4/1992 | McShane et al. .............. 357/72 |
| 5,146,314 A | | 9/1992 | Pankove ........................ 357/82 |
| 5,172,213 A | * | 12/1992 | Zimmerman ................. 257/796 |
| 5,291,064 A | | 3/1994 | Kurokawa .................... 257/714 |
| 5,319,237 A | * | 6/1994 | Legros ......................... 257/522 |
| 5,354,717 A | | 10/1994 | Pollock et al. ............... 437/225 |
| 5,376,587 A | | 12/1994 | Buchmann et al. .......... 437/209 |
| 5,397,917 A | | 3/1995 | Ommen et al. .............. 257/698 |
| 5,434,094 A | * | 7/1995 | Kobiti et al. ................. 438/167 |
| 5,451,551 A | * | 9/1995 | Krishnan et al. ............ 438/628 |
| 5,500,540 A | | 3/1996 | Jewell et al. ................... 257/82 |
| 5,508,230 A | | 4/1996 | Anderson et al. ............ 437/183 |
| 5,543,657 A | * | 8/1996 | Diffenderfer et al. ........ 257/666 |
| 5,610,442 A | | 3/1997 | Schneider et al. ........... 257/787 |
| 5,616,957 A | * | 4/1997 | Kajihara ....................... 257/712 |
| 5,644,163 A | | 7/1997 | Tsuji ............................ 257/706 |
| 5,753,529 A | * | 5/1998 | Chang et al. ................. 438/118 |
| 5,814,149 A | * | 9/1998 | Shintani et al. .............. 117/104 |
| 5,895,972 A | | 4/1999 | Paniccia ....................... 257/706 |
| 5,907,189 A | * | 5/1999 | Mertol ......................... 257/787 |
| 5,986,885 A | * | 11/1999 | Wyland ........................ 361/704 |
| 6,035,527 A | * | 3/2000 | Tamm ............................ 29/852 |
| 6,127,724 A | * | 10/2000 | DiStefano .................... 257/675 |

FOREIGN PATENT DOCUMENTS

| | | | |
|---|---|---|---|
| EP | 0297894-a2 | * | 1/1989 |
| JP | 63-81956 | | 4/1988 |
| JP | 2-276264 A | | 11/1990 |

* cited by examiner

Primary Examiner—Eddie Lee
Assistant Examiner—Paul E Brock, II
(74) Attorney, Agent, or Firm—Blakely, Sokoloff, Taylor & Zafman LLP

(57) ABSTRACT

An integrated circuit device having an embedded heat slug. The integrated circuit device comprises, in one embodiment, a semiconductor substrate having a frontside surface and a backside surface. The semiconductor substrate includes an integrated circuit on the frontside surface. A heat slug is disposed in an opening in the backside surface of the semiconductor substrate adjacent the integrated circuit.

41 Claims, 4 Drawing Sheets

INTEGRATED CIRCUIT DEVICE HAVING AN EMBEDDED HEAT SLUG

CROSS REFERENCE TO RELATED APPLICATION

This application is a divisional application of co-pending non-provisional application Ser. No. 09/001,704 filed Dec. 30, 1997.

FIELD OF THE INVENTION

The present invention relates to the cooling of a semiconductor device, and more particularly, to a semiconductor device having an embedded heatsink.

BACKGROUND OF THE INVENTION

Within the integrated circuit industry there is a continuing effort to increase integrated circuit speed as well as device density. As a result of these efforts, there is a trend towards using flip chip technology when packaging complex high speed integrated circuits. Flip chip technology is also known as controlled collapse chip connection (C4) technology. In C4 technology, the integrated circuit die is flipped upside down. This is opposite to how integrated circuits are generally packaged today using wire bond technology. By flipping the integrated circuit die upside down, ball bonds may be used to provide direct electrical connections from the bond pads of the die directly to a corresponding set of pads on a package.

In the following discussion reference will be made to a number of drawings. The drawings are provided for descriptive purposes only and are not drawn to scale.

FIG. 1A illustrates a C4 mounted integrated circuit die 102 that is electrically coupled to a package substrate 120 by ball bonds 116. Die 102 includes a semiconductor substrate 104 that has a frontside surface 114 and a backside surface 112. The active regions 106 and 108 of the integrated circuit are formed from the frontside surface 114 of the of the semiconductor substrate 104. Because the bond pads of integrated circuit device 102 are located adjacent the frontside surface 114 of the device, the die must be flipped upside down so that it may be attached to package substrate 120.

With microprocessor core frequencies climbing into the gigahertz range, one of the major concerns in microprocessor performance is thermal management. There are well known reliability and performance concerns with very high power parts, as the junction temperature must be maintained below certain temperature limits to ensure long life of the part and also to achieve reasonable transistor performance. Specifically, there is a need to address localized cooling of very high power circuit areas on the chip.

FIG. 1B illustrates a prior art approach to dissipating heat from a C4 mounted integrated circuit device. Heat is removed from the backside surface 112 of device 102 by passing an air flow 140 over a finned heatsink 130 that is thermally coupled to the backside surface 112. In some instances, heat is dissipated from device 102 by attaching a thermally conductive heat slug to backside surface 112 and thermally coupling the heat slug to a heatsink. In other instances, the heat slug may be thermally coupled to a heat spreading plate by a heat pipe or some other low resistance path.

The semiconductor substrate 104 is typically made of silicon, or other types of semiconductor materials. These materials are capable of conducting a certain amount of heat which permits heat to be conducted from the transistor level where it is generated, through the semiconductor substrate 104, and then into the heatsink 130. However, due to non-uniform heat dissipation between different regions of the integrated circuit, there can still be local "hot spots" on the die in which the junction temperatures in one region of the die can be higher than in other regions of die. Local hot spots can lead to reduced long-term reliability of the integrated circuit, as degradation mechanisms such as electromigration are increased at elevated temperatures. Furthermore, the speed performance of the integrated circuit is reduced at higher temperatures due to decreased electron mobility in the transistors.

What is needed is a method and an apparatus for removing heat from an integrated circuit in a manner that minimizes temperature gradients across the integrated circuit.

BRIEF DESCRIPTION OF THE DRAWINGS

The present invention is illustrated by way of example and is not limited by the figures of the accompanying drawings, in which like references indicate similar elements, and in which.

DETAILED DESCRIPTION

An apparatus and method for removing heat from an integrated circuit is described. In the following description, numerous specific details are set forth such as material types, dimensions, processing steps, etc., in order to provide a thorough understanding of the present invention. However, it will be obvious to one of skill in the art that the invention may be practiced without these specific details. In other instances, well known elements and processing techniques have not been shown in particular detail in order to avoid unnecessarily obscuring the present invention. This discussion will mainly be limited to those needs associated with removing heat from flip chips. It will be recognized, however, that such focus is for descriptive purposes only and that the apparatus and methods of the present invention are applicable to other electronic devices.

Figure 1A:
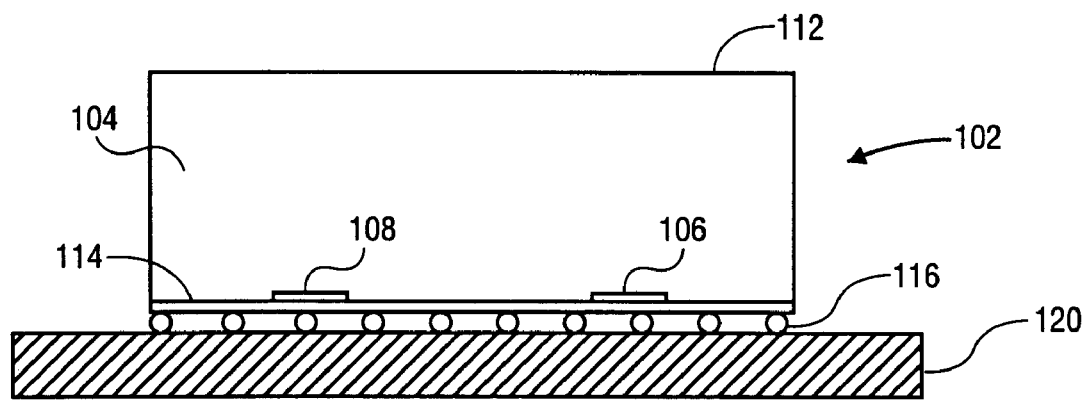
FIG. 1A illustrates a integrated circuit device that is mounted to a package using flip chip/C4 packaging technology.
Figure 1B:
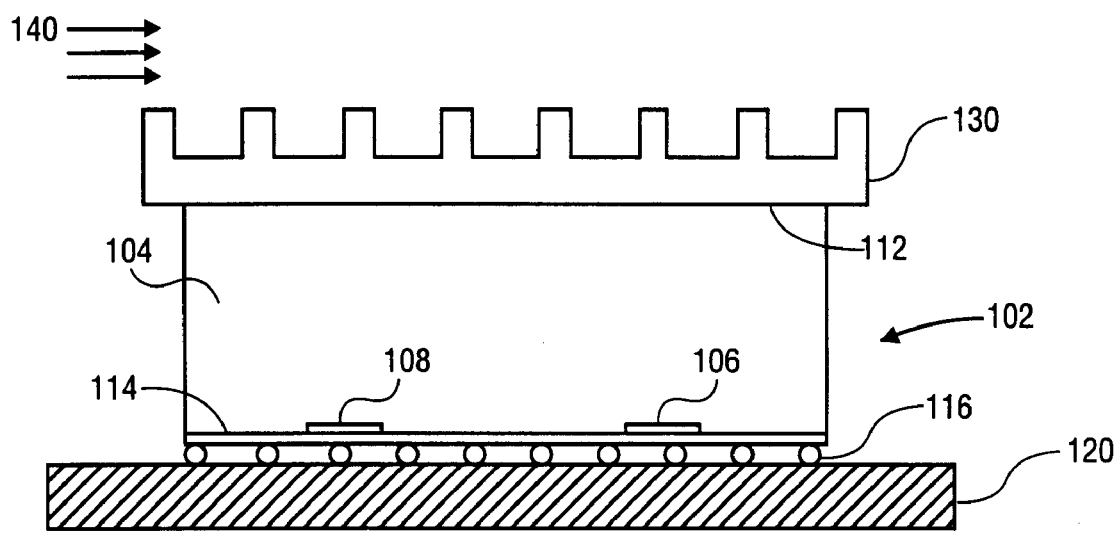
FIG. 1B illustrates the integrated circuit device of FIG. 1A having a finned heatsink attached to the backside of the semiconductor substrate.
Figure 2:
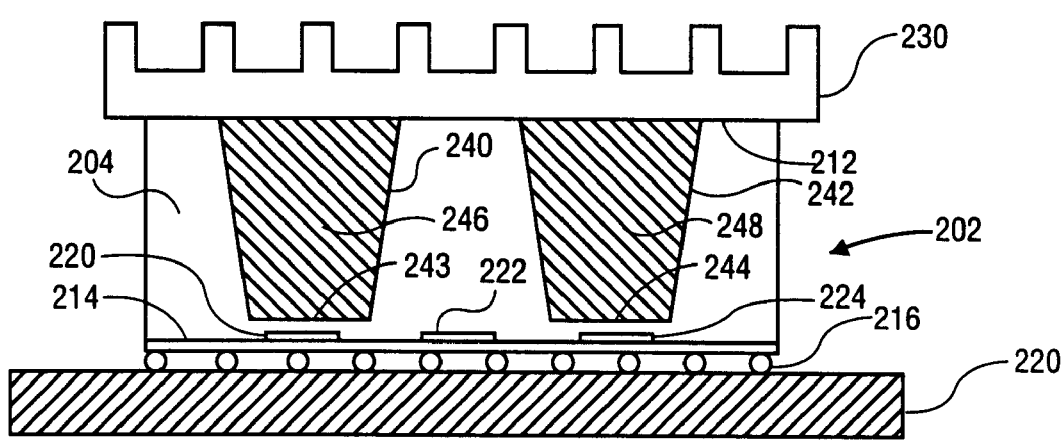
FIG. 2 is an integrated circuit device having an embedded heat slug.

FIG. 2 illustrates a side view of an integrated circuit device 202 that is electrically coupled to a package substrate 220 by ball bonds 216. Integrated circuit device 202 includes a semiconductor substrate 204 that has a frontside surface 214 and a backside surface 212. The active regions 220, 222, and 224 of the integrated circuit are formed from the frontside top surface 214 of the of the semiconductor substrate 204. Active regions 220 and 224 represent high power density regions of the integrated circuit while region 222 represents a lower power density region. Embedded heat slugs 246 and 248 are provided within the semiconductor substrate 204 adjacent the high power density regions 220 and 224. Heat slugs 246 and 248 are made of a material having a higher thermal conductivity than that of the semiconductor substrate 204.

Typically, a heatsink 230 that is thermally coupled to heat slugs 246 and 248 is attached to the backside surface 212 of device 202. In FIG. 2, a finned heatsink is shown attached to the backside surface 212 of integrated circuit device 202. It is appreciated, however, that other forms of cooling devices may be used to draw heat away from heat slugs 246 and 248. For instance, a heat pipe or other low resistance thermal path may be used to thermally couple heat slugs 246 and 248 to a heat spreading plate or other heatsink that is located external to the packaged device.

In one embodiment, heat slugs 246 and 248 are made of diamond. The diamond is deposited within recesses 240 and 242 in the semiconductor substrate by a chemical-vapor deposition process. Since some crystal forms of diamond have thermal conductivities approximately twelve times larger than that of silicon, diamond provides an excellent means for pulling heat away from the high power density regions of the integrated circuit and out to the backside surface 212 of device 202. Note, however, that the type of heat slug material used may vary depending upon the particular heat removal requirements.

The placement of heat slugs 246 and 248 in close proximity to the high power density regions 220 and 224 reduces the thermal gradients that would otherwise be induced by these regions.

Figure 3:
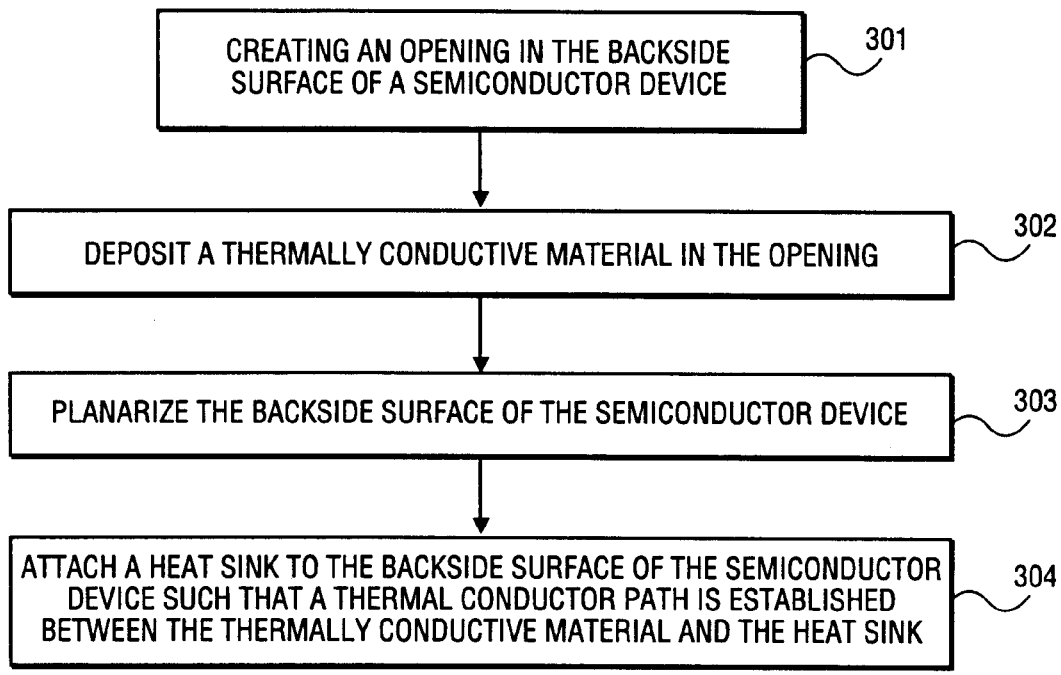
FIG. 3 is a flow chart of a method for creating an embedded heat slug in an integrated circuit device.

FIG. 3 is a flow chart of a process for creating the embedded heat slugs 246 and 248. In step 301, openings 240 and 242 are created within the backside surface 212 of semiconductor substrate 204. The semiconductor substrate 204 may be chemically etched or micro-machined to form the openings. This step may be performed on the wafer, die, or package level. It is preferable to thin the semiconductor substrate so that the floors 243 and 244 of the openings are in close proximity to the high power density regions 220 and 224 of the integrated circuit. In one embodiment the silicon semiconductor substrate 204 is locally etched to within 50 to 100 microns of regions 220 and 224. The localized manner in which openings 240 and 242 are produces permits the floor area of the openings to be relatively large without significantly affecting the overall mechanical strength of the integrated circuit device. For example, in one embodiment the floor area of openings 240 and 242 is approximately 1 millimeter by 1 millimeter.

In step 302, a thermally conductive material is deposited in openings 240 and 242. In one embodiment, diamond is deposited within openings 240 and 242 in a low temperature chemical-vapor deposition process. The deposition step may be performed early in the wafer fabrication process. The low temperature chemical vapor deposition process also permits the diamond deposition to be performed later at the die or package level. Other thermally conductive materials, such as copper, aluminum, gold, silver, etc., may be deposited into openings 240 and 242 using standard evaporation, sputtering or electroplating processes.

In step 303, the deposited material is planarized to produce a flat surface along the backside of the semiconductor substrate 204. Planarization is generally achieved by mechanical grinding the backside surface 212 of substrate 204.

In step 304, a heatsink is attached to the backside surface 212 of semiconductor substrate 204. The heatsink is typically mounted to the backside surface 212 through a highly conductive thermal compound such as a thermal grease or thermal adhesive.

In order to test and debug C4 mounted integrated circuit devices a number of optical-based testing methods, such as laser probing, have been developed that permit probing of internal portions of an integrated circuit through the backside of the C4 mounted devices. Since the active regions of the integrated circuit are located near the backside surface of the device, it is easier to access these regions for the purposes of laser probing. Note also that the metal interconnects in the first metal layer of the integrated circuit generally carry the most valuable electrical data for debugging purposes. Metal interconnect lines in the first metal layer reside closest to the semiconductor substrate and are usually directly coupled to important components of the integrated circuit device such as transistors, resistors and capacitors. It is the electrical data received, manipulated, and transmitted by these components that a designer is most interested in analyzing during the debugging process. As such, the testing of first layer metal interconnects may be simplified with the use of an optical-based backside testing method.

Another advantage of the present invention is that it permits the designer to strategically place embedded infrared transparent heat slugs at locations that will likely require optical probing during debug or testing. Infra-red transparent materials such as diamond may be deposited into openings 240 and 242 to produce the heat slugs.

Figure 4:
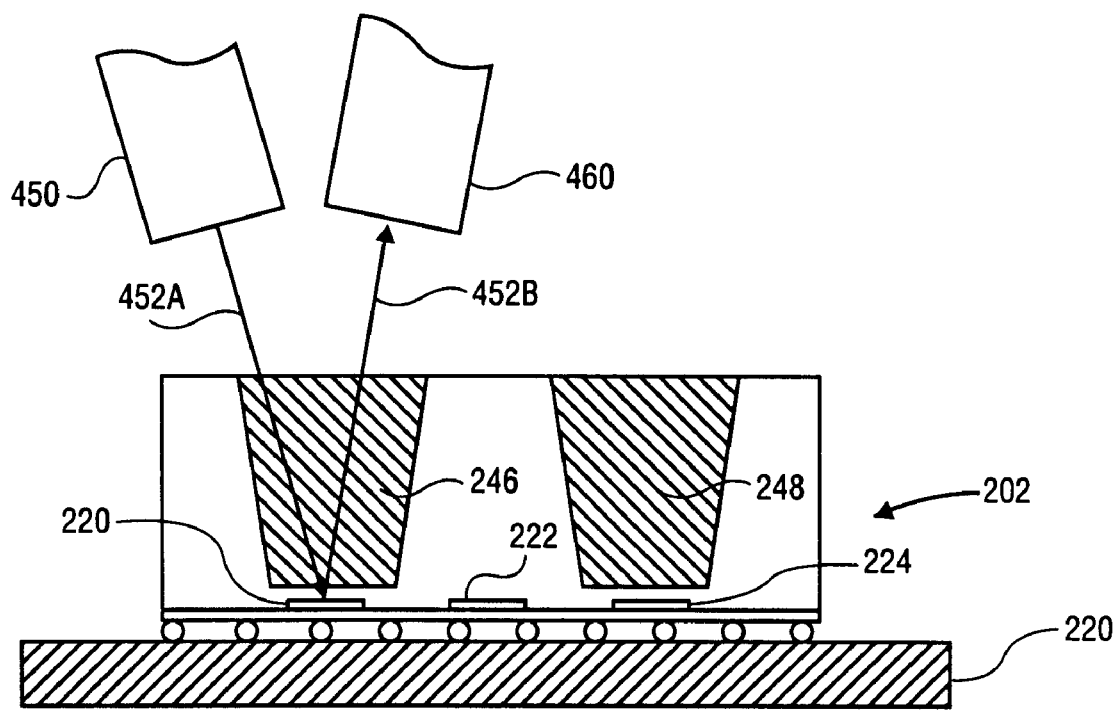
FIG. 4 shows the integrated circuit device of FIG. 2 being tested using a laser probe.

Turning now to FIG. 4, the integrated circuit device 202 of FIG. 2 is shown being probed by a laser beam 452. Probing of integrated circuit 202 is achieved by positioning a laser 450 above integrated circuit device 202 and directing a laser beam 452a through heat slug 246 and onto a P-N junction, metal interconnect, etc., located within region 220 of the Integrated circuit. A reflected laser beam 452b is produced as laser beam 452a is reflected from a metal contact or metal layer in the circuit. A detector 460 measures reflected laser beam 452b. The phase shift between laser beam 452a and 452b is measured to determine the voltage at the P-N junction. It is appreciated that the laser probing apparatus of FIG. 4 is only exemplary of one of many optical probing configurations that may be used to test the integrated circuit.

Thus, what has been described is an apparatus and method for removing heat from an integrated circuit. In the foregoing detailed description, the methods and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. A method comprising:
    cooling a portion of an integrated circuit located on a frontside surface of a semiconductor substrate, said semiconductor substrate having a backside surface opposite said frontside surface, said portion comprising a high power density region of said integrated circuit;
    creating an opening in said backside surface of said semiconductor substrate adjacent said portion of said integrated circuit, wherein a distance between said backside surface of said semiconductor substrate and a floor of said opening is greatest directly above said high power density region;
    depositing a thermally conductive, infrared transparent material in said opening so that the thermally conductive material is embedded in close proximity directly above the high power region; and planarizing said backside surface of said semiconductor substrate after depositing said thermally conductive material in said opening.

2. The method of claim 1 further comprising thermally coupling said thermally conductive material to a heat sink.

3. The method of claim 1 wherein said opening extends from said backside surface of said semiconductor substrate to a point located within 100 microns above said portion of said integrated circuit.

4. The method of claim 1 wherein creating said opening includes chemically etching said backside surface of said semiconductor substrate.

5. The method of claim 1 wherein creating said opening includes etching said backside surface of said semiconductor substrate using a gas-assisted laser etching system.

6. The method of claim 1 wherein creating said opening includes etching said backside surface of said semiconductor substrate using a focused ion beam.

7. The method of claim 1 wherein creating said opening includes milling said backside surface of said semiconductor substrate.

8. The method of claim 1 further comprising planarizing said backside surface of said semiconductor substrate after depositing said thermally conductive material in said opening.

9. The method of claim 1 wherein said thermally conductive material has a thermal conductivity greater than the thermal conductivity of said semiconductor substrate.

10. The method of claim 1 wherein said thermally conductive material comprises diamond.

11. The method of claim 1 wherein depositing said thermally conductive material comprises a chemical vapor deposition process.

12. A method comprising:
creating an embedded heat slug in a semiconductor substrate having an integrated circuit device on a frontside surface thereof, said semiconductor substrate having a backside surface opposite said frontside surface;
creating an opening in said backside surface of said semiconductor substrate adjacent a portion of said integrated circuit, said portion comprising a high power density region of said integrated circuit, wherein a distance between said backside surface of said semiconductor substrate and a floor of said opening is greatest directly above said high power density region;
depositing a thermally conductive, infrared transparent material, in said opening so that the thermally conductive material is embedded in close proximity directly above the high power region; and
planarizing said backside surface of said semiconductor substrate after depositing said thermally conductive material in said opening.

13. The method of claim 12 further comprising thermally coupling said thermally conductive material to a heat sink.

14. The method of claim 13 wherein the heat sink comprises a heat pipe.

15. The method of claim 12 wherein said opening in said backside surface extends from said backside surface of said semiconductor substrate to a point located within 100 microns above said portion of said integrated circuit.

16. The method of claim 12 wherein creating said opening includes chemically etching said backside surface of said semiconductor substrate.

17. The method of claim 12 wherein creating said opening includes etching said backside surface of said semiconductor substrate using a gas-assisted laser etching system.

18. The method of claim 12 wherein creating said opening includes etching said backside surface of said semiconductor substrate using a focused ion beam.

19. The method of claim 12 wherein creating said opening includes milling said backside surface of said semiconductor substrate.

20. The method of claim 12 further comprising planarizing said backside surface of said semiconductor substrate after depositing said thermally conductive material in said opening.

21. The method of claim 12 wherein said thermally conductive material has a thermal conductivity greater than the thermal conductivity of said semiconductor substrate.

22. The method of claim 12 wherein said thermally conductive material comprises diamond.

23. The method of claim 12 wherein depositing said thermally conductive material comprises a chemical vapor deposition process.

24. The method of claim 2 wherein the heat sink comprises a heat pipe.

25. A method comprising:
cooling a portion of an integrated circuit located on a frontside surface of a semiconductor substrate, said semiconductor substrate having a backside surface opposite said frontside surface, wherein cooling said portion of an integrated circuit includes creating an opening in said backside surface of said semiconductor substrate adjacent a portion of said integrated circuit, said portion of said integrated circuit comprising a high power density region of said integrated circuit, wherein a distance between said backside surface of said semiconductor substrate and a floor of said opening is greatest directly above said high power density region, embedding a thermally conductive, infrared transparent material in said opening to fill said opening so that the thermally conductive, infrared transparent material is in close proximity directly above the high power region, and planarizing said backside surface of said semiconductor substrate after embedding said thermally conductive material in said opening.

26. The method of claim 25 further comprising thermally coupling said thermally conductive material to a heat sink.

27. The method of claim 26 wherein said heat sink comprises a heat pipe.

28. The method of claim 25 wherein said opening extends from said backside surface of said semiconductor substrate to a point located within 100 microns above said portion of said integrated circuit.

29. The method of claim 25 wherein creating said opening includes chemically etching said backside surface of said semiconductor substrate.

30. The method of claim 25 wherein creating said opening includes etching said backside surface of said semiconductor substrate using a gas-assisted laser etching system.

31. The method of claim 25 wherein creating said opening includes etching said backside surface of said semiconductor substrate using a focused ion beam.

32. The method of claim 25 wherein creating said opening includes milling said backside surface of said semiconductor substrate.

33. The method of claim 25 wherein said thermally conductive material has a thermal conductivity greater than the thermal conductivity of said semiconductor substrate.

34. The method of claim 25 wherein said thermally conductive material comprises diamond.

35. The method of claim 25 wherein depositing said thermally conductive material comprises a chemical vapor deposition process.

36. The method of claim 25 further comprising passing an air flow over a finned heat sink thermally coupled to said backside surface.

37. The method of claim 25 further comprising attaching the thermally conductive material to said backside surface of said semiconductor substrate and thermally coupling said thermally conductive material to a heat sink.

38. The method of claim 37 wherein said heat sink comprises a heat pipe.

39. The method of claim 25 further comprising thermally coupling the thermally conductive material to a heat spreading plate by a heat pipe.

40. A method comprising:

choosing a location to embed a thermally conductive, infrared transparent heat slug in a semiconductor substrate having an integrated circuit device on a frontside surface thereof, said semiconductor substrate having a backside surface opposite said frontside surface, and wherein choosing said location to embed said heat slug includes selecting a high power density region;

creating an opening in said backside surface of said semiconductor substrate adjacent said integrated circuit device, wherein a distance between said backside surface of said semiconductor substrate and a floor of said opening is greatest directly above said high power density region;

embedding said heat slug in said opening to fill said opening so that the heat slug is in close proximity directly above the high power density region; and planarizing said backside surface of said semiconductor substrate after embedding said heat slug in said opening.

41. The method of claim 40 wherein choosing said location to embed said heat slug includes selecting a location that will require optical probing.

* * * * *